United States Patent [19]

Chambers et al.

[11] Patent Number: 5,032,809

[45] **Date of Patent: * Jul. 16, 1991**

[54] ELECTRICAL CONNECTORS

[75] Inventors: Jeffrey Chambers; John C. Frodsham, both of Ulverston, England

[73] Assignee: Oxley Developments Company Limited, London, England

[ * ] Notice: The portion of the term of this patent subsequent to Jul. 10, 2007 has been disclaimed.

[21] Appl. No.: 501,525

[22] Filed: Mar. 28, 1990

[30] Foreign Application Priority Data

Mar. 30, 1989 [GB] United Kingdom ................. 8907141

[51] Int. Cl.$^{5}$ ........................ H03H 7/00; H01R 13/66

[52] U.S. Cl. .................................... 333/183; 333/182; 333/185; 439/608; 439/620

[58] Field of Search ................................ 333/181-185, 333/12; 439/607, 608-610, 620

[56] References Cited

U.S. PATENT DOCUMENTS

| | | | |
|---|---|---|---|
| 4,187,481 | 2/1980 | Boutros | 333/182 |
| 4,729,752 | 3/1988 | Dawson, Jr. et al. | 333/185 X |
| 4,747,789 | 5/1988 | Gliha | 333/185 X |
| 4,820,202 | 4/1989 | Edwards et al. | 333/185 X |
| 4,940,420 | 7/1990 | Chambers et al. | 439/608 |

*Primary Examiner*—Eugene R. LaRoche

*Assistant Examiner*—Seung Ham

*Attorney, Agent, or Firm*—Staas & Halsey

[57] ABSTRACT

A multiway connector assembly comprising a tubular metal outer casing, a plurality of electrical lead-through terminations which extend through the outer casing, the terminations being coupled to respective pi-section filters, each of which is formed by two annular discoidal capacitors separated by a tubular inductive element. The outer electrodes of the capacitors of the pi-section filters are connected to metal earth planes which are held in the outer casing by a first releasable retention clip such as to be in electrical connection with the casing. The inner electrodes of the capacitors are connected to associated ones of the terminations by way of respective contact clips which enable relative displacement of the capacitors and terminations for purposes of assembly and disassembly. A plurality of transient absorption devices are mounted on a circuit board through which the lead-through terminations extend and which is held releasably in the outer casing by way of a further retention clip such as to connect the one side of the transient absorption devices to the casing. The circuit board is coupled to the terminations by further contact clips which connect the terminations to the other sides of the associated transient absorption devices.

6 Claims, 2 Drawing Sheets

ELECTRICAL CONNECTORS

BACKGROUND OF THE INVENTION

The present invention is concerned with electrical multiway connectors.

Our U.K. Patent Application No. 2 205 201A shows that capacitive and inductive elements may be mounted within a multiway circular connector in such a way that the ceramic capacitor elements are not subjected to the mechanical stresses of mating two parts of a multiway connector.

Our European Patent Application publication No. 0 399 802 shows that spring contacts associated with each filter may further reduce assembly and intermating stresses within such integrated assemblies.

The capacitor and capacitor/inductor filter elements described in the above-mentioned applications provide protection to vulnerable electronic circuitry against the effects of electromagnetic interference (emi), by providing a series impedance or shunt admittance to interference currents which would otherwise be conducted to the vulnerable circuitry. However, such circuit elements provide only limited protection against voltage transients, caused for example by lightning strikes. This limited protection results only when the risetime of the voltage spike is sufficiently short that the (Fourier equivalent) frequency content of the spike is correspondingly high enough for the capacitor element of the filter to provide an effective by-pass to ground.

Additional protection is needed in such cases, to limit both the maximum voltage and total energy transmitted to the vulnerable circuitry within the enclosure to be protected. Such protection commonly takes the form of a further shunt element, such as a varistor or transient absorbing diode. Such elements are reverse voltage breakdown devices, providing a low resistance to ground under high voltage excursion conditions. Typical limiting conditions of operation include maximum pulse current and total dissipated energy.

However, due to their inherently high series impedance, such so-called 'transient absorbing' elements are not effective as high frequency filter elements where a low impedance to ground is required at frequencies from a few tens of kHz to in excess of 1 GHz. Therefore, combinations of feedthrough filter elements and transient absorbing elements are required to protect vulnerable electronic circuitry from both the destructive effects of high frequency electromagnetic interference conducted on wires passing into the equipment, and the destructive effects of typically lightning-induced conducted voltage/current transients.

Whilst transient absorbing elements are readily available and may be mounted on a printed circuit board mounted within an equipment, this utilises a large amount of space. In addition, in such known arrangements, the filter elements when mounted in the connectors may receive stress themselves from the incoming voltage transient.

It would thus be desirable to provide a single connector assembly which contains both transient absorption elements and rfi suppression filters. Whilst transient absorbing elements may be mounted in chip form upon the termination itself, the space available severely limits the device size and its current/energy handling ability.

SUMMARY OF THE INVENTION

It is therefore an object of the present invention to provide a system which contains both transient absorption elements and rfi suppression filters in such a manner that any increase in the size of the device are minimised.

In accordance with the present invention, there is provided a multiway connector assembly comprising a tubular metal outer casing, a plurality of electrical lead-through terminations which extend through the outer casing the terminations being coupled to respective pi-section filters, each of which is formed by two annular discoidal capacitors separated by a tubular inductive element, the outer electrodes of the capacitors of the pi-section filters being connected to metal earth planes which are held in the outer casing by first releasable retention means such as to be in electrical connection therewith, and the inner electrodes of the capacitors being connected to associated ones of the terminations by way of respective contact clips which are adapted to enable relative displacement of the capacitors and terminations for purposes of assembly and disassembly, and wherein a plurality of transient absorption devices is mounted on a circuit board through which the lead-through terminations extend and which is held releasably in the outer casing by way of said first or a further retention means such as to connect the one sides of the transient absorption devices to the casing, the circuit board being coupled to the terminations by further contact clips which connect said terminations to the other sides of the associated transient absorption devices.

Advantageously, there is a first earth plane associated with and rigidly connected to first ones of the two capacitors of the pi-section filters and a second earth plane associated with and rigidly connected to the second ones of the two capacitors in the pi-section filters.

By this means, both rfi suppression filters and transient absorption devices can be contained within the connector casing itself without substantial increase in the size of the casing and in such a manner that access to such devices can be readily obtained for purposes of repair or replacement.

BRIEF DESCRIPTION OF THE DRAWINGS

The invention is described further hereinafter, by way of example only, with reference to the accompanying drawings, in which.

DETAILED DESCRIPTION OF THE PREFERRED EMBODIMENTS

Figure 1:
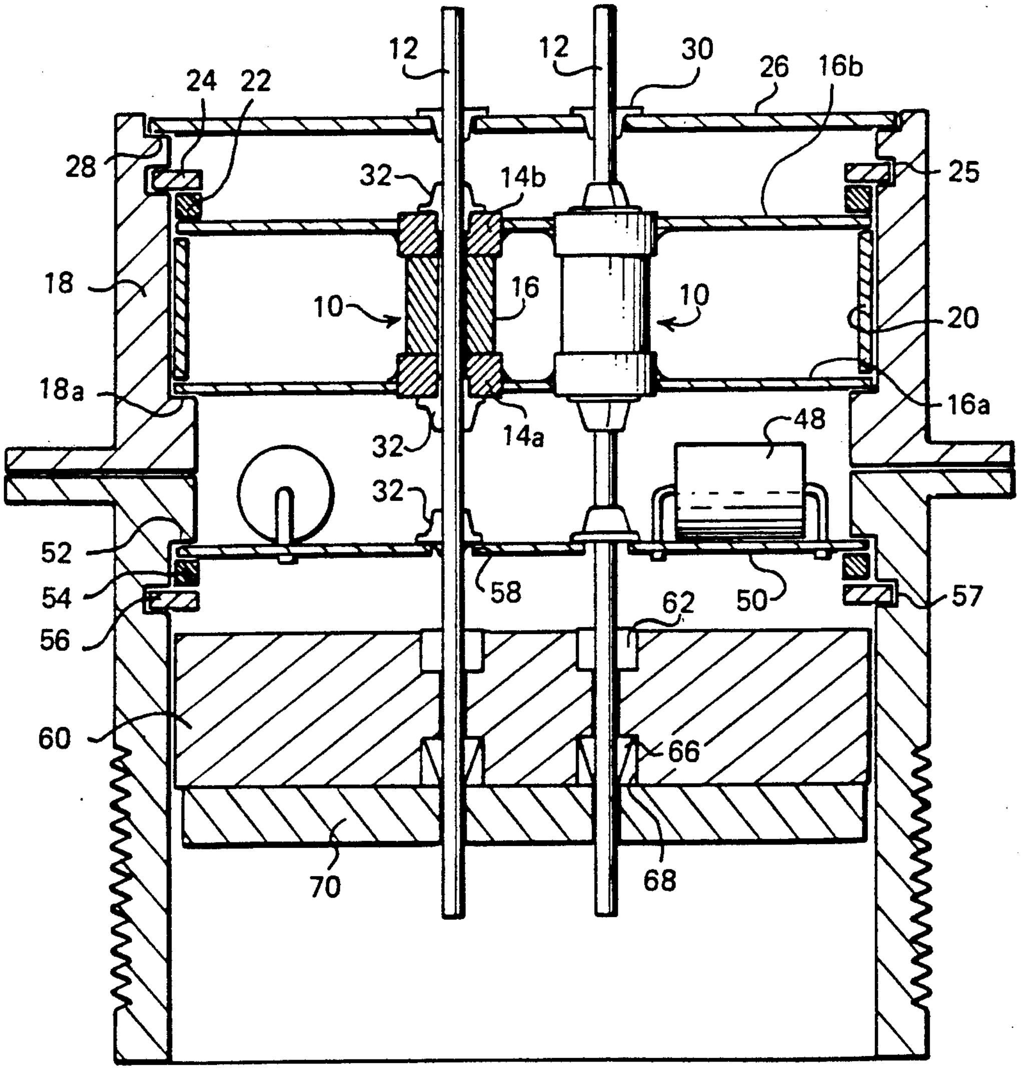
FIG. 1 is a diagrammatic longitudinal section through one embodiment of a two-part multiway connector in accordance with the present invention.

FIG. 1 shows a multiway connector in which an array of pi-section filters 10 is assembled over a plurality of lead-through terminations 12. Each filter 10 comprises two discoidal, multi-layer capacitors 14*a*, 14*b*, whose outer peripheries are soldered to two metal ground planes 16*a*, 16*b*, respectively, and a tube 16 of a ferrite material disposed between the capacitors. The metal plates forming the ground planes 16*a*, 16*b* are accommodated within a tubular metal housing 18 and are spaced apart by a conductive spacer tube 20, the ground plane 16a abutting a shoulder 18a on the housing. This position of the ground planes is maintained by a resilient thrust washer 22 (which may itself be conductive) and a retaining ring 24, such that there is ensured a good electrical connection between both earth planes 16a, 16b and the outer metal casing 18. The ring 24 is received in a groove 25 in the housing wall.

The free ends of the terminations 12 projecting out of the casing 18 are guided by means of an apertured stiffening board 26 made of a hard plastics material (e.g. phenolic) which is received with an interference fit within the inner periphery of the casing 18 so as to engage against a shoulder 28. The terminations can be guided through holes in the stiffening board by means of respective alignment bushes 30.

As shown in FIG. 1, each capacitor 14a, 14b is connected electrically to the associated termination 12 passing through it by means of a respective spring contact clip 32 which is constructed such that it can be firmly coupled to the capacitors but can slide along the termination 12 for the purposes of assembly and disassembly of the connector. Two typical examples of such contact clips are shown in FIGS. 3a and 3b.

Figure 3A:
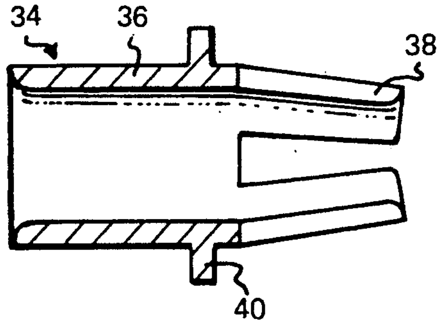
FIGS. 3*a* and 3*b* are longitudinal sections through two embodiments of contacts clips which can be used in the connector of FIG. 1.

The clip 34 of FIG. 3a comprises a tubular member 36 whose one end (right-hand end in FIG. 3a) is longitudinally slotted to form a plurality of contact fingers 38 which are bent slightly inwardly so that they will firmly grip the periphery of a lead-through termination when pushed over same. The clips 34 also include an outwardly directed flange 40 which can be used to solder the clips 34 to the capacitors 14, with the cylindrical left-hand portions of the clips received snugly within the inner peripheries of the discoidal capacitors.

Figure 3B:
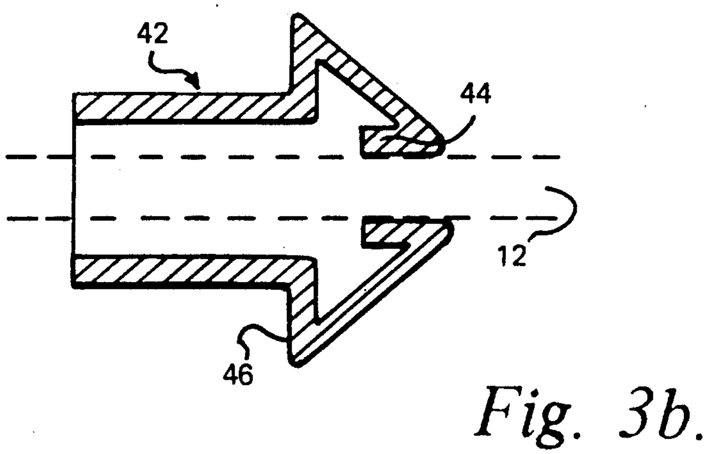

The clip 42 of FIG. 3b is in the form of a metal tube whose one end (left-hand) is adapted to be received snugly within the inner peripheries of the capacitor 14 and whose other end is deformed outwardly and inwardly to form a narrowed mouth 44 which resiliently grips a termination 12 passed therethrough. Shoulder portions 46 on the clips 42 form areas where the clips can be soldered to the capacitors.

It will be appreciated that by virtue of the use of the clips, with the locking ring 24 and spacer 22 removed, the assembly comprised by the capacitors, clips and ground planes can be slid along the lead-through terminations 12 for the purposes of assembly or of disassembly.

Figure 2:
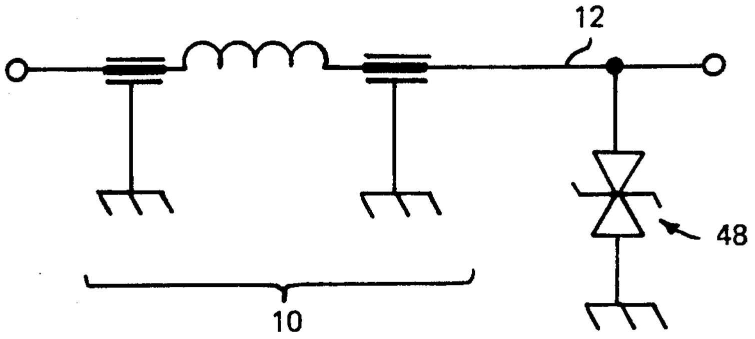
FIG. 2 is a circuit diagram illustrating the circuit configuration at each termination.

Referring now to FIG. 2, there is represented in diagrammatic form at the left-hand side of the figure one of the pi-section filters 10 of FIG. 1. As shown in FIG. 2, in order to provide the necessary transient protection within the connector, there is connected across each pi-section filter 10 a transient absorption element (in this case a transient absorbing diode 48). The diode 48 is therefore to be connected between the relevant lead-through termination 12 and ground.

Returning now to FIG. 1, the transient absorbing elements 48 associated with the respective pi-section filters 10 (only two shown in FIG. 1) are all mounted on a printed circuit board 50. The circuit board 50 is held against a shoulder 52 on the housing 18 by means of a resilient thrust washer 54 and retaining ring 56 such that circuitry on the board connects one side of each transient absorbing element 48 to the outer casing 18 (ground). The retaining ring 56 is received in a circular groove 57 in the housing wall. The circuit board 50 contains a plurality of holes 58 each of which receives a respective one of the lead-through terminations 12. Further circuitry on the board connects the other sides of each transient absorbing element 48 to respective ones of the lead-through terminations by way of further contact clips 32, similar or the same as those used to couple the capacitors 14a, 14b to the terminations 12. Thus, each contact clip 32 is rigidly attached to the board, e.g. by soldering, but can slide over the associated termination 12 while ensuring electrical connection therewith.

Also disposed over the terminations 12 within the tubular metal housing 18 is a housing block 60 of insulating material. Mechanical stresses from contact mating in use of the connector are eliminated by using collets 62 (preferably metal collets) which are inserted into counterbores 64 on one surface of the housing block 60. When pressed in place, each collet firmly grips the respective lead-through terminations 12 as the outer surfaces of the collets bear in the insides of the counterbores 64 in the rigid insulation block 60. Respective retention clips 66 are disposed over the terminations 12 in further counterbores 68 in the opposite surface of the housing block 60. A final disc 70 of insulating material abuts the housing block 60.

Thus, it will be evident that the circuit board 50 can easily be removed for servicing or total replacement merely by withdrawing the housing block 60 and disc 70, removing the retaining ring 56 and washer 54, and then sliding the circuit board out along the terminations 12.

It will be noted that the two-part construction of the outer body 18 as shown in FIG. 1 is advantageous in that it aids disassembly for repair and rework, by allowing the transient protection circuit board 50 to be removed without disturbing the capacitor planes. The two parts may be mechanically connected by any suitable means.

It should be emphasised that many variations on the particular configurations illustrated in FIG. 1 can be adopted within the scope of the invention. Thus, for example, the circuit board 50 can be mounted on the opposite sides of the earth planes 16a, 16b; the retention means (thrust washer and retaining ring) for the earth planes 14a, 14b and circuit board 50, can be any suitable means which achieves releasable retention within the housing 18; and the particular configuration of the clips can be different to that illustrated, consistent with providing spring contact to the terminations.

We claim:

1. A multiway connector assembly comprising:
- a tubular metal outer casing;
- a plurality of electrical lead-through terminations which extend through the outer casing;
- respective pi-section filters coupled to said terminations, said pi-section filters each being formed by two annular discoidal capacitors separated by a tubular inductive element;
- metal earth plane means connected to outer electrodes of the capacitors of the pi-section filters;
- first releasable retention means which hold said metal earth planes in the outer casing such as to be in electrical connection with said outer casing;
- respective contact clip means connecting inner electrodes of said capacitors of the pi-section filters to associated ones of said terminations, said contact clip means being adapted to enable relative displacement of the capacitors and terminations for purposes of assembly and disassembly;

a circuit board means;

second releasable retention means which holds said circuit board means within said outer casing such that said terminations extend through said circuit board means;

a plurality of transient absorption devices which have first and second termination electrodes and which are mounted on said circuit board means, with their first termination electrodes connected electrically to said outer casing; and further contact clip means which couple said terminations to said circuit board means and which connect said terminations to the second termination electrodes of the associated ones of said transient absorption devices.

2. A multiway connector assembly comprising:

a tubular metal outer casing;

a plurality of electrical lead-through terminations which extend through the outer casing;

respective pi-section filters coupled to said terminations, said pi-section filters each being formed by two annular discoidal capacitors separated by a tubular inductive element;

metal earth plane means connected to outer electrodes of the capacitors of the pi-section filters;

releasable retention means which hold said metal earth planes in the outer casing such as to be in electrical connection with said outer casing;

respective contact clip means connecting inner electrodes of said capacitors of the pi-section filters to associated ones of said terminations, said contact clip means being adapted to enable relative displacement of the capacitors and terminations for purposes of assembly and disassembly;

a circuit board means which is held within said outer casing by said releasable retention means such that said terminations extend through said circuit board means;

a plurality of transient absorption devices which have first and second termination electrodes and which are mounted on said circuit board means, with their first termination electrodes connected electrically to said outer casing; and further contact clip means which couple said terminations to said circuit board means and which connect said terminations to the second termination electrodes of the associated ones of said transient absorption devices.

3. A multiway connector assembly according to claim 1, wherein at least some of said clips means comprise a tubular member whose one end is longitudinally slotted to form a plurality of contact fingers which are bent slightly inwardly so that they will firmly grip the periphery of a lead-through termination when pushed over same, the tubular member also having an outwardly directed flange which can be used to solder the clip to one of the discoidal capacitors, with a cylindrical portion at the other end of the clip received snugly within the inner periphery of that one of the discoidal capacitor.

4. A multiway connector assembly according to claim 1, wherein at least some of said clips means comprise a metal tube whose one end is adapted to be received snugly within the inner periphery of one of the capacitors and whose other end is deformed outwardly and inwardly to form a narrowed mouth which resiliently grips a termination passed therethrough, shoulder portions being provided on the clips to form areas where the clips can be soldered to the capacitors.

5. A multiway connector assembly according to claim 1, wherein said second releasable retention means comprises a spring retention clip adapted to be received in a circular internal groove in the wall of said outer casing and a resilient thrust washer disposed between the clip and the circuit board.

6. A multiway connector assembly according to claim 1, wherein the first releasable retention means comprises a spring retention clip adapted to be received in a circular internal groove in the wall of said outer casing and a resilient thrust washer disposed between the clip and said metal earth plane means.

* * * * *